(12) United States Patent
Desu

(10) Patent No.: US 10,622,559 B2
(45) Date of Patent: Apr. 14, 2020

(54) RESISTIVE MEMORY DEVICE HAVING A TEMPLATE LAYER

(71) Applicant: 4DS Memory, Limited, West Perth (AU)

(72) Inventor: Seshubabu Desu, Fremont, CA (US)

(73) Assignee: 4DS MEMORY, LIMITED, Perth, Western Australia ( * ) Notice: Subject to any disclaimer, the term of this patent is extended or adjusted under 35 U.S.C. 154(b) by 0 days.

(21) Appl. No.: 16/398,218

(22) Filed: Apr. 29, 2019

(65) Prior Publication Data

US 2019/0288198 A1    Sep. 19, 2019

Related U.S. Application Data

(63) Continuation of application No. 15/923,992, filed on Mar. 16, 2018, now Pat. No. 10,319,907.

(51) Int. Cl.
*G11C 11/00* (2006.01)
*H01L 45/00* (2006.01)
*G11C 13/00* (2006.01)

(52) U.S. Cl.
CPC ........ *H01L 45/1233* (2013.01); *G11C 13/004* (2013.01); *G11C 13/0007* (2013.01); *G11C 13/0069* (2013.01); *H01L 45/08* (2013.01); *H01L 45/1246* (2013.01); *H01L 45/1266* (2013.01); *H01L 45/147* (2013.01); *H01L 45/16* (2013.01); *H01L 45/1608* (2013.01); *G11C 2013/009* (2013.01); *G11C 2013/0045* (2013.01); *G11C 2213/13* (2013.01); *G11C 2213/31* (2013.01); *G11C 2213/51* (2013.01);
(Continued)

(58) Field of Classification Search
CPC ... G11C 11/00; G11C 13/0007; G11C 13/004; G11C 13/0069; H01L 45/1233; H01L 45/08
USPC ............ 365/46, 94, 100, 129, 148, 158, 163
See application file for complete search history.

(56) References Cited

U.S. PATENT DOCUMENTS

| 8,106,375 B2 | 1/2012 | Chen et al. |
| 8,817,522 B2 | 8/2014 | Ramaswamy et al. |
| 9,947,866 B2 | 4/2018 | Takahashi |

(Continued)

FOREIGN PATENT DOCUMENTS

| JP | 2005-236003 A | 9/2005 |
| KR | 10-1450093 B1 | 10/2014 |
| KR | 10-1744758 B1 | 6/2017 |

OTHER PUBLICATIONS

International Search Report and Written Opinion from International Patent Application No. PCT/IB2019/000269, dated Aug. 23, 2019, 9 pages.

(Continued)

*Primary Examiner* — Harry W Byrne
(74) *Attorney, Agent, or Firm* — Kilpatrick Townsend & Stockton LLP

(57) ABSTRACT

A memory device including a template layer is disclosed. The memory device also includes a memory layer connected to the template layer, where the memory layer has a variable resistance, and where the crystalline structure of the memory layer matches the crystalline structure of the template layer. The memory device also includes a conductive top electrode on the memory layer, where the top electrode and the memory layer cooperatively form a heterojunction memory structure.

24 Claims, 4 Drawing Sheets

(52) U.S. Cl.
CPC ...... *G11C 2213/52* (2013.01); *G11C 2213/55* (2013.01)

(56) References Cited

U.S. PATENT DOCUMENTS

| | | | |
|---|---|---|---|
| 10,319,907 B1 | 6/2019 | Desu | |
| 2007/0120124 A1 | 5/2007 | Chen et al. | |
| 2007/0153563 A1* | 7/2007 | Nirschl | G11C 11/5678 365/148 |
| 2009/0020751 A1 | 1/2009 | Chen et al. | |
| 2009/0237977 A1* | 9/2009 | Ramani | G11C 11/5678 365/148 |
| 2010/0296331 A1* | 11/2010 | Ramani | G11C 11/5678 365/148 |
| 2013/0010528 A1* | 1/2013 | Ramani | G11C 11/5678 365/148 |
| 2013/0322155 A1* | 12/2013 | Ahn | G11C 13/0002 365/148 |
| 2014/0056053 A1 | 2/2014 | Ramaswamy et al. | |
| 2014/0133210 A1 | 5/2014 | Ichihara et al. | |
| 2015/0332748 A1 | 11/2015 | Wang et al. | |
| 2017/0077100 A1 | 3/2017 | Takahashi | |
| 2017/0170237 A1 | 6/2017 | Jung | |
| 2019/0019551 A1 | 1/2019 | Lee | |

OTHER PUBLICATIONS

U.S. Appl. No. 15/923,992 , "Notice of Allowance", dated Jan. 17, 2019, 8 pages.
U.S. Appl. No. 15/923,992 , "Restriction Requirement", dated Nov. 15, 2018, 5 pages.
U.S. Appl. No. 15/923,992 , "Supplemental Notice of Allowability", dated Apr. 3, 2019, 10 pages.
U.S. Appl. No. 15/924,014 , "Non-Final Office Action", dated Feb. 14, 2019, 12 pages.
U.S. Appl. No. 15/924,043 , "Non-Final Office Action", dated Feb. 7, 2019, 9 pages.

* cited by examiner

RESISTIVE MEMORY DEVICE HAVING A TEMPLATE LAYER

CROSS-REFERENCE TO RELATED APPLICATIONS

This application is a continuation of U.S. patent application Ser. No. 15/923,992, entitled "RESISTIVE MEMORY DEVICE HAVING A TEMPLATE LAYER," filed Mar. 16, 2018, which is incorporated herein by reference for all purposes.

FIELD OF THE INVENTION

The present invention relates generally to nonvolatile memory devices, and more particularly to memory devices having effective speed comparable to DRAM, which do not require speed-crippling error correction and include hetero junctions of oxide materials.

BACKGROUND OF THE INVENTION

In general, memory devices or systems can be segmented in 3 distinct categories: internet-of-things (IoT) memories, embedded memories, and high-density high-volume memories. The memory requirements (cost, density, speed, endurance, retention, power consumption) are quite different for each of these 3 categories.

IoT memories tend to be inexpensive, power-efficient, and low-density. Memories embedded in complex system chips tend to be fast, area-efficient, and medium-density. High-density high-volume memories must be scalable to small geometries to be cost effective.

The high-density high-volume memory category is currently dominated by DRAM (which is volatile) and NAND Flash (which is non-volatile).

DRAM is very-fast, exhibits exceptional endurance, and is therefore best suited for fast system memory. DRAM, however, is expensive and volatile (for example, the data may need to be refreshed every 60 milliseconds) and sacrifices retention to maximize speed and endurance.

In sharp contrast, NAND Flash is inexpensive with much higher bit capacity and good retention, and is best suited for low-cost silicon storage. NAND Flash, however, sacrifices both speed and endurance to maximize retention.

Being limited to two dimensions (2D), DRAM will likely remain expensive since silicon area largely defines cost per gigabyte. In contrast, the cost of NAND Flash is expected to decline over time because of three dimensional (3D) stacking. The cost gap between DRAM and NAND Flash will likely increase over time.

DRAM and NAND Flash fit their sweet spots near perfectly and it seems highly unlikely that a universal memory combining the best of DRAM and NAND Flash will ever exist. It is equally unlikely that any emerging memory technology will replace DRAM because its speed and endurance combination is exceptionally hard to beat. Furthermore, there is no economic justification to build a NAND Flash replacement for high-density applications while NAND Flash prices continue to decrease.

However, as data processing and storage needs continue their rapid increase for mobile devices and cloud data centers, the industry needs a new non-volatile memory with attributes much closer to DRAM (because it is impossible to replace) than to NAND Flash (because it does not need to be replaced).

This vast space between DRAM and NAND Flash is therefore an opportunity for innovation.

Storage Class Memory is an emerging non-volatile memory segment positioned between the most successful system memory (DRAM) and the most successful silicon storage (NAND Flash). There are many opportunities for new memories in the vast space between DRAM and NAND Flash, each with different speed, endurance and retention metrics.

The biggest opportunities are always where the difficulty is greatest and that is in the space closest to DRAM. The ultimate market demand is therefore for Storage Class Memory with DRAM speed, the highest endurance achievable with this speed, a cost per gigabyte closer to NAND Flash, and a pragmatic retention far superior to DRAM retention.

Furthermore, certain semiconductor memory technologies have applied a principal of geometric redundancy, where multiple data bits may be stored in a single cell. This property of a memory cell to support a multiple of values is sometimes referred to as its dynamic range. To date the for memory cells have abilities to support a dynamic range anywhere between 1 and 4 bits. These combined properties of semiconductors have increased capacities and reduced costs.

Another issue associated with semiconductor memory manufacturing has been the substantial costs of the semiconductor foundries which can be more than a billion dollars to establish. Amortizing expenses increase the cost of memory chips. Now, with advances in foundry resolutions enabling smaller cell sizes and the geometric redundancy of multiple bit-level per memory cell semiconductor memory is actually cheaper per unit cost, and substantially more rugged in terms of high G forces than memory files on a disk drive.

In Flash memories, there have been improvements, but they have become susceptible to write cycle limitations and ability to support dynamic ranges are diminished as the quantum limit is approached. Another issue with Flash memory is its limitations in write speeds and the number of write cycle limitations the cell will tolerate before it permanently fails.

Accordingly, what is desired is a memory system and method which overcomes the above-identified problems. The systems and methods should be easily implemented, cost effective, and adaptable to existing storage applications.

BRIEF SUMMARY OF THE INVENTION

One general aspect includes a memory device, including a template layer. The memory device also includes a memory layer connected to the template layer, where the memory layer has a variable resistance, and where the crystalline structure of the memory layer matches the crystalline structure of the template layer. The memory device also includes a conductive top electrode on the memory layer, where the top electrode and the memory layer cooperatively form a heterojunction memory structure.

Implementations may include one or more of the following features. The memory device where the conductivity of the template layer is greater than $10 \times 10^6$ s m-1. The memory device further including a retention layer between the memory layer and the top electrode, where the retention layer has a variable ionic conductivity, and is configured to selectively resist ionic conduction. The memory device where the resistivity of the retention layer is less than $1 \times 10^{-4}$ ohm-m. The memory device where a first contact formed at an interface between the template layer and the memory layer is ohmic, and where a second contact formed at an interface between the template layer and the top electrode is ohmic. The memory device further including: a first barrier layer, configured to substantially prevent the conduction of ions or vacancies therethrough, where the top electrode is between the first barrier layer and the memory layer; and a second barrier layer, configured to substantially prevent the conduction of ions or vacancies therethrough, where the template layer is between the second barrier layer and the memory layer. The memory device where the first and second barrier layers each have a resistivity less than 1 e-4 ohm-m. The memory device further including a side barrier layer, where the first and second barrier layers and the side barrier layer define an enclosed space, where the top electrode and the memory layer are within the space, and where ions of the top electrode and the memory layer are confined to the space by the first and second barrier layers and the side barrier layer.

Another general aspect includes a method of manufacturing a memory device, the method including forming a template layer. The method also includes connecting a memory layer to the template layer, where the memory layer has a variable resistance, and where the crystalline structure of the memory layer matches the crystalline structure of the template layer. The method also includes forming a conductive top electrode on the memory layer, where the top electrode and the memory layer cooperatively form a heterojunction memory structure.

Implementations may include one or more of the following features. The method where the conductivity of the template layer is greater than 10×106 s m-1. The method further including forming a retention layer between the memory layer and the top electrode, where the retention layer has a variable ionic conductivity, and is configured to selectively resist ionic conduction. The method where the resistivity of the retention layer is less than 1×10-4 ohm-m. The method where a first contact formed at an interface between the template and the memory layer is ohmic, and where a second contact formed at an interface between the template and the top electrode is ohmic. The method further including: forming a first barrier layer, where the first barrier layer is configured to substantially prevent the conduction of ions or vacancies therethrough, and where the top electrode is between the first barrier layer and the memory layer; and forming a second barrier layer, where the second barrier layer is configured to substantially prevent the conduction of ions or vacancies therethrough, and where the template layer is between the second barrier layer and the memory layer. The method where the first and second barrier layers each have a resistivity less than 1 e-4 ohm-m. The method further including forming a side barrier layer, where the first and second barrier layers and the side barrier layer define an enclosed space, where the top electrode and the memory layer are within the space, and where ions of the top electrode and the memory layer are confined to the space by the first and second barrier layers and the side barrier layer.

Another general aspect includes a method of using a memory device, the memory device including a template layer, a memory layer connected to the template layer, the memory layer having a variable resistance, where the crystalline structure of the memory layer matches the crystalline structure of the template layer, and where the memory device further includes a conductive top electrode on the memory layer, where the top electrode and the memory layer cooperatively form a heterojunction memory structure. The method includes applying a first voltage difference across the template layer and the top electrode, where an electric field is generated in the memory layer, and such that a resistivity state of the memory layer is changed. The method also includes applying a second voltage difference across the template layer and the top electrode. The method also includes while the second voltage difference is applied, causing a first current to be conducted through the template layer, the memory layer, and the top electrode. The method also includes determining the resistivity state of the memory layer based on the second voltage and the first current.

Implementations may include one or more of the following features. The method where the conductivity of the template layer is greater than 10×106 s m-1. The method where the memory device further includes a retention layer between the memory layer and the top electrode, where the retention layer has a variable ionic conductivity, and is configured to selectively resist ionic conduction, and where the method further includes varying the ionic conductivity of the retention layer with the applied first voltage. The method where the resistivity of the retention layer is less than 1×10-4 ohm-m. The method where the memory device further includes: a first barrier layer, configured to substantially prevent the conduction of ions or vacancies therethrough, where the top electrode is between the first barrier layer and the memory layer; and a second barrier layer, configured to substantially prevent the conduction of ions or vacancies therethrough, where the template layer is between the second barrier layer and the memory layer, where the method further includes causing the first current to be conducted through the first and second barrier layers. The method where the first and second barrier layers each have a resistivity less than 1 e-4 ohm-m. The method where the memory device further includes a side barrier layer, where the first and second barrier layers and the side barrier layer define an enclosed space, where the top electrode and the memory layer are within the space, and where the method further includes confining ions of the top electrode and the memory layer to the space with the first and second barrier layers and the side barrier layer.

DETAILED DESCRIPTION OF THE INVENTION

Particular embodiments of the invention are illustrated herein in conjunction with the drawings.

Various details are set forth herein as they relate to certain embodiments. However, the invention can also be implemented in ways which are different from those described herein. Modifications can be made to the discussed embodiments by those skilled in the art without departing from the invention. Therefore, the invention is not limited to particular embodiments disclosed herein.

The present invention is related to a nonvolatile memory device. The memory device can be utilized in a variety of applications from a free standing nonvolatile memory to an embedded device in a variety of applications. These applications include but are not limited to embedded memory used in a wide range of SOC (system on chip), switches in programmable or configurable ASIC, solid state drive used in computers and servers, memory sticks used in mobile electronics like camera, cell phone, iPod® etc. The memory device comprises a first metal layer and a first metal oxide layer coupled to the first metal layer. The memory device includes a second metal oxide layer coupled to the first metal oxide layer and a second metal layer coupled to the second metal oxide layer. These metal and metal oxide layers can be of a variety of types and their use will be within the spirit and scope of the present invention. More particularly, some of the embodiments disclosed herein will include PCMO as one of the metal oxide layers. It is well understood by one of ordinary skill in the art that the present invention should not be limited to this metal oxide layer or any other layer disclosed herein, as other metal oxide layers may alternatively be used.

Figure 1:
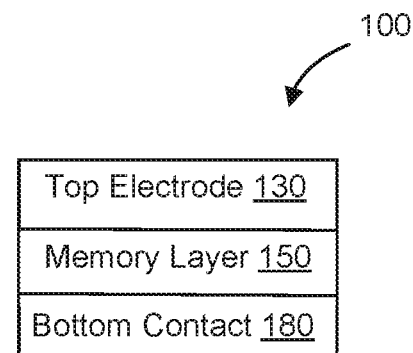
FIG. 1 is a schematic illustration of a memory device according to an embodiment.

FIG. 1 is an illustration of a memory device 100 which includes a conductive Platinum (Pt) bottom contact 180, which is coupled to a Praseodymium Calcium Manganese Oxide (PCMO) memory layer 150, which is coupled to a metal top electrode layer 130.

Top electrode layer 130 forms an electrical connection between the memory layer 150 and another device. Top electrode layer 130 is formed with a material which forms a secure bond with the memory layer 150.

Top electrode layer 130 cooperatively forms a metal oxide heterojunction memory with memory layer 150, and is configured to accept or donate oxygen ions or vacancies from or to memory layer 150 in response to an electric field applied across the electrode layer 130 and the memory layer 150. In some embodiments, the top electrode layer 130 may be oxygen-rich and may cooperatively form an oxygen ion heterojunction memory cell with memory layer 150. In alternative embodiments, the top electrode layer 130 may be oxygen depleted and may cooperatively form an oxygen vacancy heterojunction memory cell with memory layer 150.

As understood by those of skill in the art, the resistivity of the memory layer 150 is dependent on the concentration of oxygen ions or vacancies therein. Therefore, memory device 100 functions as a rewritable memory cell, where the state of the memory device corresponds with the resistivity of the memory layer 150. The memory layer 150 is written by applying a voltage to induce an electric field to force the concentration of the oxygen ions or vacancies to a desired concentration state, and the desired concentration state corresponds with a desired resistivity state. As a result, the resistance of the memory layer is programmed by the write operation. To read the state of the memory cell, a voltage or a current may be applied to the cell. A current or voltage generated in response to the applied voltage or current is dependent on the resistance state of the memory cell, and may be sensed to determine the resistance state.

Figure 2:
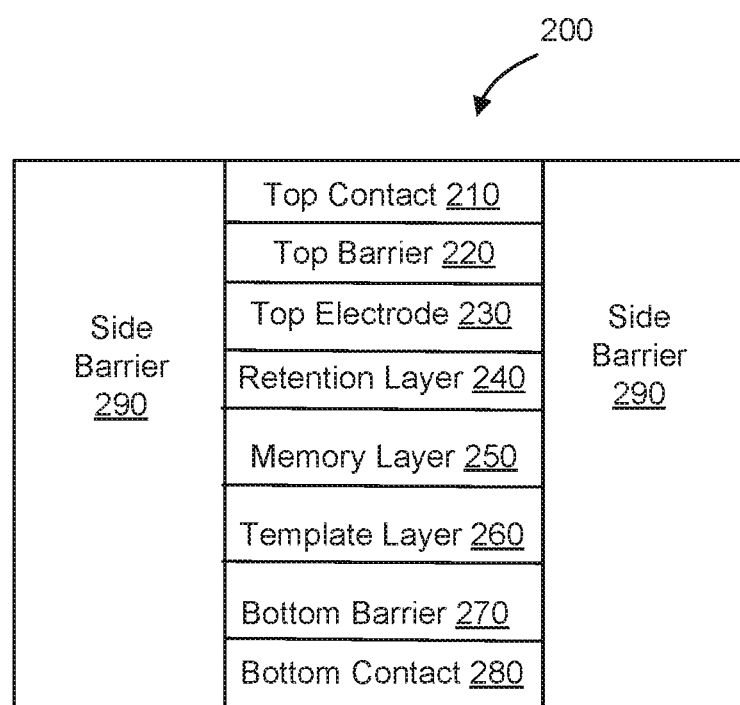
FIG. 2 is a schematic illustration of a memory device according to an embodiment.

FIG. 2 is a schematic illustration of a memory device 200 according to an embodiment. Memory device 200 includes bottom contact 280, conductive bottom barrier layer 270, template layer 260, memory layer 250, optional retention layer 240, top electrode layer 230, top barrier layer 220, top contact 210, and side barrier layer 290. In some embodiments, side barrier layer 290 is substantially annular and surrounds bottom contact 280, conductive bottom barrier layer 270, template layer 260, memory layer 250, retention layer 240 (if present), top electrode layer 230, top barrier layer 220, and top contact 210.

Memory device 200 may be formed by forming bottom contact 280, forming conductive bottom barrier layer 270 on bottom contact 280, forming template layer 260 on conductive bottom barrier layer 270, forming memory layer 250 on template layer 260, optionally forming retention layer 240 on memory layer 250, forming top electrode layer 230 on retention layer 240 or on memory layer 250, forming top barrier layer 220 on top electrode layer 230, forming top contact 210 on top barrier layer 220, and forming side barrier layer 290 on both lateral sides of each of bottom contact 280, conductive bottom barrier layer 270, template layer 260, memory layer 250, retention layer 240 (if present), top electrode layer 230, top barrier layer 220, and top contact 210.

In some embodiments, each of the interfaces of the various layers of memory device 200 forms an ohmic contact between the layers.

In some embodiments, top contact 210 includes at least one of Copper (Cu), Aluminum (Al), Tungsten (W), Ruthenium (Ru), Platinum (Pt), Iridium (Ir), and Rhodium (Rh). In alternative embodiments, one or more other materials are used.

Top contact 210 is used to form an electrical connection between the memory device 200 and other electrical components. Top contact 200 may also be used to form a mechanical connection between the memory device 200 and another device.

In some embodiments, top barrier layer 220 includes at least one of Titanium Nitride (TiN), Tantalum Nitride (TaN), Titanium Aluminum Nitride (TiAlN), Tantalum Aluminum Nitride (TaAlN), Titanium Silicon Nitride (TiSiN), Tantalum Silicon Nitride (TaSiN), and Titanium Tungsten (TiW). In alternative embodiments, one or more other materials are used.

Top barrier layer 220 may be formed of a material having a band gap wider than that of one or more of the top electrode layer 230, any retention layer 240, and the memory layer 250. Top barrier layer 220 is configured to substantially prevent the conduction of oxygen ions or vacancies during operation of the memory device 200. Accordingly, top barrier layer 220 substantially prevents oxygen ions or vacancies from escaping from the top electrode layer 230 into the top barrier layer 220. In addition, top barrier layer 220 is configured to conduct electrical current between the top electrode layer 230 and the top contact 210. For example, top barrier layer 220 may have a resistivity less than 1 E-4 ohm-m.

The top barrier layer 220 may be formed using any deposition process, such as PVD, CVD, sputtering, evaporation, ALD, or another deposition or growth process. Furthermore, in some embodiments, top barrier layer 220 experiences substantially no chemical reaction with the top electrode 230, such that the characteristics of the top barrier layer 220 and the top electrode 230 remain substantially unaffected by one another. Also, in some embodiments, substantially no diffusion occurs between the top barrier layer 220 and the top electrode 230, such that the characteristics of the memory layer 250 and the retention layer 240 remain substantially unaffected by one another.

In some embodiments, top electrode layer 230 includes at least one of Tungsten (W), Molybdenum (Mo), Nickel (Ni), Iron (Fe), Cobalt (Co), and Chromium (Cr). In alternative embodiments, one or more other materials are used. For example, another metal, conductive oxide, or other conductive compound may be use.

Top electrode layer 230 forms an electrical connection between the retention layer 240 or the memory layer 250 and the top barrier layer 220. Top electrode layer 230 is formed with a material which forms a secure bond with the retention layer 240 or the memory layer 250.

Top electrode layer 230 cooperatively forms a metal oxide heterojunction memory with memory layer 250, and is configured to accept or donate oxygen ions or vacancies from or to memory layer 250 in response to an electric field applied across the electrode layer 230 and the memory layer 250. In some embodiments, the top electrode layer 230 may be oxygen-rich and may cooperatively form an oxygen ion heterojunction memory cell with memory layer 250. In alternative embodiments, the top electrode layer 230 may be oxygen depleted and may cooperatively form an oxygen vacancy heterojunction memory cell with memory layer 250.

In some embodiments, optional retention layer 240 includes at least one of SnOx, InOx, (IN,SN)Ox, and doped ZnO. In alternative embodiments, one or more other materials are used.

In some embodiments, retention layer 240 has high electrical conductivity. For example, retention layer 240 may have a resistivity less than 1 E-4 ohm-m. Retention layer 240 may also be selectively resistant to conduction of oxygen ions and vacancies in response to an applied electric field. In addition, voltage dependence of the ionic conductivity of retention layer 240 may be highly non-linear. Furthermore, retention layer 240 may experience no chemical interaction with the top electrode layer 230 and memory layer 250. Additionally, retention layer 240 may form an ohmic contact with top electrode 230.

Data retention in the memory cell is greatly influenced by the diffusion of oxygen ions and oxygen vacancies between the top electrode layer 230 and the memory layer 250. Retention layer 240 may be placed between the top electrode layer 230 and the memory layer 250 and improves memory cell retention. Because retention layer 240 is resistant to conduction of oxygen ions and vacancies, oxygen ions and vacancies are less likely to diffuse between the oxide on the retention layer 240 side of top electrode layer 230 and the memory layer 250, and data retention is improved. In addition, because retention layer 240 is electrically conductive, electrical performance of the memory cell experiences little or substantially no degradation as a consequence of retention layer 240.

The retention layer 240 may be formed using any deposition process, such as PVD, CVD, sputtering, evaporation, ALD, or another deposition or growth process. Furthermore, in some embodiments, retention layer 240 experiences substantially no chemical reaction with the memory layer 250, such that the characteristics of the memory layer 250 and the retention layer 240 remain substantially unaffected by one another. Also, in some embodiments, substantially no diffusion occurs between the retention layer 240 and the memory layer 250, such that the characteristics of the memory layer 250 and the retention layer 240 remain substantially unaffected by one another.

In some embodiments, memory layer 250 includes at least one of Praseodymium Calcium Manganese Oxide or (Pr1-xCax)MnO$_3$ (PCMO), (Sm1-xCax)MnO$_3$, and (La1-xSrx)MnO$_3$. In alternative embodiments, one or more other materials are used. In some embodiments, the memory layer 250 is between about 5 nm and about 10 nm thick.

In some embodiments, template layer 260 includes at least one of LaNiO$_3$, NdNiO$_3$, SrRuO$_3$, CaRuO$_3$, and LaMnO$_3$. In alternative embodiments, one or more other materials are used.

The electrical conductivity of the template layer 260 is similar to conductivity of commonly used metallic bottom electrodes, such as Ru. For example, the electrical conductivity of the template layer 260 may be greater than about $10 \times 10^6$ S m$^{-1}$. In some embodiments, the electrical conductivity of the template layer 260 is greater than about $15 \times 10^6$ S m$^{-1}$, is greater than about $20 \times 10^6$ S m$^{-1}$, is greater than about $30 \times 10^6$ S m$^{-1}$, or is greater than about $50 \times 10^6$ S m$^{-1}$. In addition, the crystalline structure and lattice parameters of the template layer 260 are similar to those of the memory layer 250. For example, the crystalline structure and lattice parameters of the template layer match the crystalline structure and lattice parameters of the memory layer 250. Consequently, misfit stresses between the template layer 260 and the memory layer 250 are less than that which would occur in the memory layer 250 if the memory layer 250 were formed directly on the bottom barrier 270.

In some embodiments, the template layer 260 behaves as a latency layer at least partly because of its low resistivity. Accordingly, the resistance of the memory device 200 is lowered. This, combined with the effect of the retention layer 240 and the high on/off resistance ratio, increases the memory window, such that low read voltages may be used. For example, the read voltage can be about 0.5V, about 0.4V, 0.3V, 0.2V, 0.1V or lower.

The template layer 260 may be formed using any deposition process, such as physical vapor deposition (PVD), chemical vapor deposition (CVD), sputtering, evaporation, atomic layer deposition (ALD), or another deposition or growth process.

In some embodiments, memory layer 250 may be epitaxially grown on template layer 260. In some embodiments, the memory layer 250 is formed into thin films (e.g. epitaxially grown crystalline thin films) on the template layer 260 at temperatures lower than 450 C. In some embodiments, the temperature while forming the template layer 260 may be 400 C. or less, 350 C. or less, 300 C. or less, 250 C. or less, or 200 C. or less. Because of the low temperature while forming the template layer 260, the template layer 260 may be formed as part of a CMOS manufacturing process.

Furthermore, in some embodiments, template layer 260 experiences substantially no chemical reaction with the memory layer 250, such that the characteristics of the memory layer 250 remain substantially unaffected by the template layer 260. Also, in some embodiments, substantially no diffusion occurs between the template layer 260 and the memory layer 250, such that the characteristics of the memory layer 250 remain substantially unaffected by the template layer 260.

In some embodiments, the crystalline film of the memory layer 250 may be grown on an amorphous template layer 260 acting as a growth seed. In some embodiments, the crystalline film of the memory layer 250 may be grown on a crystalline template layer 260 acting as a seed. When the memory layer 250 is grown, the ambient environment (e.g., Ar and O$_2$) may have a pressure between 9 and 10 torr. In some embodiments, water is removed from the ambient environment.

In some embodiments, when the memory layer 250 is formed on the template layer 260, no or substantially no amorphous memory layer 250 or interface layer is formed at the interface between the memory layer 250 and the template layer 260. Accordingly, the thickness of the memory layer 250 is reduced, which is beneficial for high density devices.

The typical on/off resistance ratio (the ratio of the resistance of the on or low resistance state of the memory device 200 to the resistance of the off or high resistance state of the memory device 200) for interface switching material films is not amenable for multi-bit storage in a single cell. However, in embodiments such as that illustrated in FIG. 2, because of the substantially defect free interface between the memory layer 250 and the template layer 260 and because of the high quality crystalline structure of the memory layer 250, few, if any, oxygen ions are trapped by crystal defects, such that substantially all of the oxygen ions are free to migrate between the memory layer 250 and the top electrode 230, and the on/off resistance ratio of the memory device 200 is maximized. For example, the on/off resistance ratio may be 2 or greater, 5 or greater, 10 or greater, 20 or greater, 35 or greater, 50 or greater, 75 or greater, or 100 or greater.

In some embodiments, conductive bottom barrier layer 270 includes at least one of Titanium Nitride (TiN), Tantalum Nitride (TaN), Titanium Aluminum Nitride (TiAlN), Tantalum Aluminum Nitride (TaAlN), Titanium Silicon Nitride (TiSiN), Tantalum Silicon Nitride (TaSiN), and Titanium Tungsten (TiW). In alternative embodiments, one or more other materials are used. In some embodiments, conductive bottom barrier layer 270 is formed of substantially the same material as the top barrier layer 220.

Bottom barrier layer 270 may be formed of a material having a band gap wider than that of one or more of the template layer 260, any retention layer 240, and the memory layer 250. Bottom barrier layer 270 is configured to substantially prevent the conduction of oxygen ions or vacancies during operation of the memory device 200. Accordingly, bottom barrier layer 270 substantially prevents oxygen ions or vacancies from escaping from the template layer 260 into the bottom barrier layer 270. In addition, bottom barrier layer 270 is configured to conduct electrical current between the template layer 260 and the bottom contact 280. For example, bottom barrier layer 270 may have a resistivity less than 1 E-4 ohm-m.

The bottom barrier layer 270 may be formed using any deposition process, such as PVD, CVD, sputtering, evaporation, ALD, or another deposition or growth process. Furthermore, in some embodiments, bottom barrier layer 270 experiences substantially no chemical reaction with the bottom contact 280, such that the characteristics of the bottom barrier layer 270 and the bottom contact 280 remain substantially unaffected by one another. Also, in some embodiments, substantially no diffusion occurs between the bottom barrier layer 270 and the bottom contact 280, such that the characteristics of the bottom barrier layer 270 and the bottom contact 280 remain substantially unaffected by one another.

In some embodiments, bottom contact 280 includes at least one of Copper (Cu), Aluminum (Al), Tungsten (W), Ruthenium (Ru), Platinum (Pt), Iridium (Ir), and Rhodium (Rh). In alternative embodiments, one or more other materials are used. In some embodiments, bottom contact 280 is formed of substantially the same material as the top contact 210.

In some embodiments, side barrier 290 includes at least one of AlOx, $SiO_2$, and $Si_3N_4$. In alternative embodiments, one or more other materials are used.

Reliability of interface switching memories which conduct ions and vacancies between layers depends critically on losses of the critical species from the cell. Therefore, techniques to prevent any losses of the critical species from the cell during the cycling and retention are beneficial.

In memory device 200, top barrier layer 220, bottom barrier layer 270, and side barrier layers 290 have little or substantially zero oxygen ion diffusion coefficients, such that the oxygen ions and vacancies are confined to top electrode layer 230, retention layer 240 (if present), memory layer 250, and template layer 260 by top barrier layer 220, bottom barrier layer 270, and side barrier layers 290. As a result, the reliability of memory device 200 is excellent.

The side barrier layers 290 may be formed using any deposition process, such as PVD, CVD, sputtering, evaporation, ALD, or another deposition or growth process. Furthermore, in some embodiments, side barrier layers 290 experience substantially no chemical reaction with the other layers, such that the characteristics of the side barrier layers 290 and the other layers remain substantially unaffected by one another. Also, in some embodiments, substantially no diffusion occurs between the side barrier layers 290 and the other layers, such that the characteristics of the side barrier layers 290 and the other layers remain substantially unaffected by one another.

In certain embodiments, bottom contact 280 is formed with Cu, conductive bottom barrier layer 270 is formed with TaN, template layer 260 is formed with LaNiO3, memory layer 250 is formed with PCMO, retention layer 240 is formed with SnO, top electrode layer 230 is formed with W, top barrier layer 220 is formed with TaN, and top contact 210 is formed with Cu.

In certain embodiments, bottom contact 280 is formed with Ru, conductive bottom barrier layer 270 is formed with TaN, template layer 260 is formed with $SrRuO_3$, memory layer 250 is formed with PCMO, retention layer 240 is formed with doped ZnO, top electrode layer 230 is formed with W, top barrier layer 220 is formed with TaN, and top contact 210 is formed with Ru.

In certain embodiments, bottom contact 280 is formed with W, conductive bottom barrier layer 270 is formed with TaN, template layer 260 is formed with CaRuO3, memory layer 250 is formed with $(SmCa)MnO_3$, retention layer 240 is formed with InOx, top electrode layer 230 is formed with W, top barrier layer 220 is formed with TaN, and top contact 210 is formed with Cu.

Figure 3:
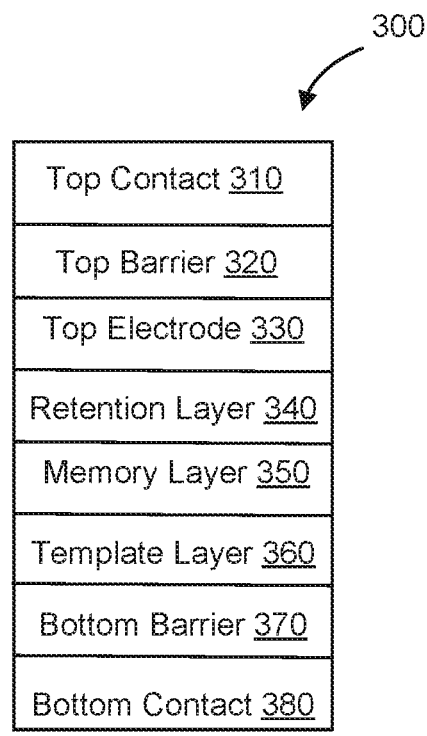
FIG. 3 is a schematic illustration of a memory device according to an embodiment.

FIG. 3 is a schematic illustration of a memory device 300 according to an embodiment. Memory device 300 includes bottom contact 380, conductive bottom barrier layer 370, template layer 360, memory layer 350, optional retention layer 340, top electrode layer 330, top barrier layer 320, and top contact 310.

Memory device 300 may be formed by forming bottom contact 380, forming conductive bottom barrier layer 370 on bottom contact 380, forming template layer 360 on conductive bottom barrier layer 370, forming memory layer 350 on template layer 360, optionally forming retention layer 340 on memory layer 350, forming top electrode layer 330 on retention layer 340 or on memory layer 350, forming top barrier layer 320 on top electrode layer 330, and forming top contact 310 on top barrier layer 320.

In some embodiments, each of the interfaces of the various layers of memory device 300 forms an ohmic contact between the layers.

Top contact 310 may have characteristics similar or identical to those of top contact 210 discussed elsewhere herein.

Top contact 310 is used to form an electrical connection between the memory device 300 and other electrical components. Top contact 300 may also be used to form a mechanical connection between the memory device 300 and another device.

Top barrier layer 320 may have characteristics similar or identical to those of top barrier layer 220 discussed elsewhere herein.

Top barrier layer 320 may be formed of a material having a band gap wider than that of one or more of the top electrode layer 330, any retention layer 340, and the memory layer 350. Top barrier layer 320 is configured to substantially prevent the conduction of oxygen ions or vacancies during operation of the memory device 300. Accordingly, top barrier layer 320 substantially prevents oxygen ions or vacancies from escaping from the top electrode layer 330 into the top barrier layer 320. In addition, top barrier layer 320 is configured to conduct electrical current between the top electrode layer 330 and the top contact 310.

The top barrier layer 320 may be formed using any deposition process, such as PVD, CVD, sputtering, evaporation, ALD, or another deposition or growth process. Furthermore, in some embodiments, top barrier layer 320 experiences substantially no chemical reaction with the top electrode 330, such that the characteristics of the top barrier layer 320 and the top electrode 330 remain substantially unaffected by one another. Also, in some embodiments, substantially no diffusion occurs between the top barrier layer 320 and the top electrode 330, such that the characteristics of the memory layer 350 and the retention layer 340 remain substantially unaffected by one another.

Top electrode layer 330 may have characteristics similar or identical to those of top electrode layer 230 discussed elsewhere herein.

Top electrode layer 330 forms an electrical connection between the retention layer 340 or the memory layer 350 and the top barrier layer 320. Top electrode layer 330 is formed with a material which forms a secure bond with the retention layer 340 or the memory layer 350.

Top electrode layer 330 cooperatively forms a metal oxide heterojunction memory with memory layer 350, and is configured to accept or donate oxygen ions or vacancies from or to memory layer 350 in response to an electric field applied across the electrode layer 330 and the memory layer 350. In some embodiments, the top electrode layer 330 may be oxygen-rich and may cooperatively form an oxygen ion heterojunction memory cell with memory layer 350. In alternative embodiments, the top electrode layer 330 may be oxygen depleted and may cooperatively form an oxygen vacancy heterojunction memory cell with memory layer 350.

Optional retention layer 340 may have characteristics similar or identical to those of optional retention layer 240 discussed elsewhere herein.

In some embodiments, retention layer 340 may experience no chemical interaction with the top electrode layer 330 and memory layer 350. Additionally, retention layer 340 may form an ohmic contact with top electrode 330.

Data retention in the memory cell is greatly influenced by the diffusion of oxygen ions and oxygen vacancies between the top electrode layer 330 and the memory layer 350. Retention layer 340 may be placed between the top electrode layer 330 and the memory layer 350 and improves memory cell retention. Because retention layer 340 is resistant to conduction of oxygen ions and vacancies, oxygen ions and vacancies are less likely to diffuse between the oxide on the retention layer 340 side of top electrode layer 330 and the memory layer 350, and data retention is improved. In addition, because retention layer 340 is electrically conductive, electrical performance of the memory cell experiences little or substantially no degradation as a consequence of retention layer 340.

The retention layer 340 may be formed using any deposition process, such as PVD, CVD, sputtering, evaporation, ALD, or another deposition or growth process. Furthermore, in some embodiments, retention layer 340 experiences substantially no chemical reaction with the memory layer 350, such that the characteristics of the memory layer 350 and the retention layer 340 remain substantially unaffected by one another. Also, in some embodiments, substantially no diffusion occurs between the retention layer 340 and the memory layer 350, such that the characteristics of the memory layer 350 and the retention layer 340 remain substantially unaffected by one another.

Memory layer 350 may have characteristics similar or identical to those of memory layer 250 discussed elsewhere herein.

Template layer 360 may have characteristics similar or identical to those of template layer 260 discussed elsewhere herein.

The electrical conductivity of the template layer 360 is similar to conductivity of commonly used metallic bottom electrodes, such as Ru. In addition, the crystalline structure and lattice parameters of the template layer 360 are similar to those of the memory layer 350. Consequently, misfit stresses between the template layer 360 and the memory layer 350 are minimized.

In some embodiments, the template layer 360 behaves as a latency layer at least partly because of its low resistivity. Accordingly, the resistance of the memory device 300 is lowered. This, combined with the effect of the retention layer 340 and the high on/off resistance ratio, increases the memory window, such that low read voltages may be used. For example, the read voltage can be about 0.5V, about 0.4V, 0.3V, 0.2V, 0.1V or lower.

The template layer 360 may be formed using any deposition process, such as physical vapor deposition (PVD), chemical vapor deposition (CVD), sputtering, evaporation, atomic layer deposition (ALD), or another deposition or growth process.

In some embodiments, memory layer 350 may be epitaxially grown on template layer 360. In some embodiments, the memory layer 350 is formed into thin films (e.g. epitaxially grown crystalline thin films) on the template layer 360 at temperatures lower than 450 C. In some embodiments, the temperature while forming the template layer 360 may be 400 C. or less, 350 C. or less, 300 C. or less, 350 C. or less, or 300 C. or less. Because of the low temperature while forming the template layer 360, the template layer 360 may be formed as part of a CMOS manufacturing process.

Furthermore, in some embodiments, template layer 360 experiences substantially no chemical reaction with the memory layer 350, such that the characteristics of the memory layer 350 remain substantially unaffected by the template layer 360. Also, in some embodiments, substantially no diffusion occurs between the template layer 360 and the memory layer 350, such that the characteristics of the memory layer 350 remain substantially unaffected by the template layer 360.

In some embodiments, the crystalline film of the memory layer 350 may be grown on an amorphous template layer 360 acting as a growth seed. In some embodiments, the crystalline film of the memory layer 350 may be grown on a crystalline template layer 360 acting as a seed. When the memory layer 350 is grown, the ambient environment (e.g., Ar and $O_2$) may have a pressure between 9 and 10 torr. In some embodiments, water is removed from the ambient environment.

In some embodiments, when the memory layer 350 is formed on the template layer 360, no or substantially no amorphous memory layer 350 or interface layer is formed at the interface between the memory layer 350 and the template layer 360. Accordingly, the thickness of the memory layer 350 is reduced, which is beneficial for high density devices.

The typical on/off resistance ratio (the ratio of the resistance of the on or low resistance state of the memory device 300 to the resistance of the off or high resistance state of the memory device 300) for interface switching material films is not amenable for multi-bit storage in a single cell. However, in embodiments such as that illustrated in FIG. 3, because of the substantially defect free interface between the memory layer 350 and the template layer 360 and because of the high quality crystalline structure of the memory layer 350, few, if any, oxygen ions are trapped by crystal defects, such that substantially all of the oxygen ions are free to migrate between the memory layer 350 and the top electrode 330, and the on/off resistance ratio of the memory device 300 is maximized. For example, the on/off resistance ratio may be 2 or greater, 5 or greater, 10 or greater, 20 or greater, 35 or greater, 50 or greater, 75 or greater, or 100 or greater.

Conductive bottom barrier layer 370 may have characteristics similar or identical to those of conductive bottom barrier layer 270 discussed elsewhere herein. In some embodiments, conductive bottom barrier layer 370 is formed of substantially the same material as the top barrier layer 320.

Bottom barrier layer 370 may be formed of a material having a band gap wider than that of one or more of the template layer 360, any retention layer 340, and the memory layer 350. Bottom barrier layer 370 is configured to substantially prevent the conduction of oxygen ions or vacancies during operation of the memory device 300. Accordingly, bottom barrier layer 370 substantially prevents oxygen ions or vacancies from escaping from the template layer 360 into the bottom barrier layer 370. In addition, bottom barrier layer 370 is configured to conduct electrical current between the template layer 360 and the bottom contact 380.

The bottom barrier layer 370 may be formed using any deposition process, such as PVD, CVD, sputtering, evaporation, ALD, or another deposition or growth process. Furthermore, in some embodiments, bottom barrier layer 370 experiences substantially no chemical reaction with the bottom contact 380, such that the characteristics of the bottom barrier layer 370 and the bottom contact 380 remain substantially unaffected by one another. Also, in some embodiments, substantially no diffusion occurs between the bottom barrier layer 370 and the bottom contact 380, such that the characteristics of the bottom barrier layer 370 and the bottom contact 380 remain substantially unaffected by one another.

Bottom contact 380 may have characteristics similar or identical to those of conductive bottom contact 280 discussed elsewhere herein. In some embodiments, bottom contact 380 is formed of substantially the same material as the top contact 310.

Reliability of interface switching memories which conduct ions and vacancies between layers depends critically on losses of the critical species from the cell. Therefore, techniques to prevent any losses of the critical species from the cell during the cycling and retention are beneficial.

In memory device 300, top barrier layer 320 and bottom barrier layer 370 have little or substantially zero oxygen ion diffusion coefficients, such that the oxygen ions and vacancies are confined to top electrode layer 330, retention layer 340 (if present), memory layer 350, and template layer 360 by top barrier layer 320 and bottom barrier layer 370. As a result, the reliability of memory device 300 is excellent.

In certain embodiments, bottom contact 380 is formed with Cu, conductive bottom barrier layer 370 is formed with TaN, template layer 360 is formed with $LaNiO_3$, memory layer 350 is formed with PCMO, retention layer 340 is formed with SnO, top electrode layer 330 is formed with W, top barrier layer 320 is formed with TaN, and top contact 310 is formed with Cu.

In certain embodiments, bottom contact 380 is formed with Ru, conductive bottom barrier layer 370 is formed with TaN, template layer 360 is formed with $SrRuO_3$, memory layer 350 is formed with PCMO, retention layer 340 is formed with doped ZnO, top electrode layer 330 is formed with W, top barrier layer 320 is formed with TaN, and top contact 310 is formed with Ru.

In certain embodiments, bottom contact 380 is formed with W, conductive bottom barrier layer 370 is formed with TaN, template layer 360 is formed with $CaRuO_3$, memory layer 350 is formed with $(SmCa)MnO_3$, retention layer 340 is formed with InOx, top electrode layer 330 is formed with W, top barrier layer 320 is formed with TaN, and top contact 310 is formed with Cu.

Figure 4:
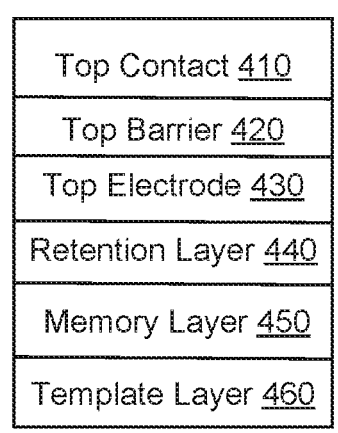
FIG. 4 is a schematic illustration of a memory device according to an embodiment.

FIG. 4 is a schematic illustration of a memory device 400 according to an embodiment. Memory device 400 includes template layer 460, memory layer 450, optional retention layer 440, top electrode layer 430, top barrier layer 420, and top contact 410.

Memory device 400 may be formed by forming template layer 460, forming memory layer 450 on template layer 460, optionally forming retention layer 440 on memory layer 450, forming top electrode layer 430 on retention layer 440 or on memory layer 450, forming top barrier layer 420 on top electrode layer 430, and forming top contact 410 on top barrier layer 420.

In some embodiments, each of the interfaces of the various layers of memory device 400 forms an ohmic contact between the layers.

Top contact 410 may have characteristics similar or identical to those of top contact 210 discussed elsewhere herein.

Top contact 410 is used to form an electrical connection between the memory device 400 and other electrical components. Top contact 410 may also be used to form a mechanical connection between the memory device 400 and another device.

Top barrier layer 420 may have characteristics similar or identical to those of top barrier layer 220 discussed elsewhere herein.

Top barrier layer 420 may be formed of a material having a band gap wider than that of one or more of the top electrode layer 430, any retention layer 440, and the memory layer 450. Top barrier layer 420 is configured to substantially prevent the conduction of oxygen ions or vacancies during operation of the memory device 400. Accordingly, top barrier layer 420 substantially prevents oxygen ions or vacancies from escaping from the top electrode layer 430 into the top barrier layer 420. In addition, top barrier layer 420 is configured to conduct electrical current between the top electrode layer 430 and the top contact 410.

The top barrier layer 420 may be formed using any deposition process, such as PVD, CVD, sputtering, evaporation, ALD, or another deposition or growth process. Furthermore, in some embodiments, top barrier layer 420 experiences substantially no chemical reaction with the top electrode 430, such that the characteristics of the top barrier layer 420 and the top electrode 430 remain substantially unaffected by one another. Also, in some embodiments, substantially no diffusion occurs between the top barrier layer 420 and the top electrode 430, such that the characteristics of the memory layer 450 and the retention layer 440 remain substantially unaffected by one another.

Top electrode layer 430 may have characteristics similar or identical to those of top electrode layer 230 discussed elsewhere herein.

Top electrode layer 430 forms an electrical connection between the retention layer 440 or the memory layer 450 and the top barrier layer 420. Top electrode layer 430 is formed with a material which forms a secure bond with the retention layer 440 or the memory layer 450.

Top electrode layer 430 cooperatively forms a metal oxide heterojunction memory with memory layer 450, and is configured to accept or donate oxygen ions or vacancies from or to memory layer 450 in response to an electric field applied across the electrode layer 430 and the memory layer 450. In some embodiments, the top electrode layer 430 may be oxygen-rich and may cooperatively form an oxygen ion heterojunction memory cell with memory layer 450. In alternative embodiments, the top electrode layer 430 may be oxygen depleted and may cooperatively form an oxygen vacancy heterojunction memory cell with memory layer 450.

Optional retention layer 440 may have characteristics similar or identical to those of optional retention layer 240 discussed elsewhere herein.

In some embodiments, retention layer 440 may experience no chemical interaction with the top electrode layer 430 and memory layer 450. Additionally, retention layer 440 may form an ohmic contact with top electrode 430.

Data retention in the memory cell is greatly influenced by the diffusion of oxygen ions and oxygen vacancies between the top electrode layer 430 and the memory layer 450. Retention layer 440 may be placed between the top electrode layer 430 and the memory layer 450 and improves memory cell retention. Because retention layer 440 is resistant to conduction of oxygen ions and vacancies, oxygen ions and vacancies are less likely to diffuse between the oxide on the retention layer 440 side of top electrode layer 430 and the memory layer 450, and data retention is improved. In addition, because retention layer 440 is electrically conductive, electrical performance of the memory cell experiences little or substantially no degradation as a consequence of retention layer 440.

The retention layer 440 may be formed using any deposition process, such as PVD, CVD, sputtering, evaporation, ALD, or another deposition or growth process. Furthermore, in some embodiments, retention layer 440 experiences substantially no chemical reaction with the memory layer 450, such that the characteristics of the memory layer 450 and the retention layer 440 remain substantially unaffected by one another. Also, in some embodiments, substantially no diffusion occurs between the retention layer 440 and the memory layer 450, such that the characteristics of the memory layer 450 and the retention layer 440 remain substantially unaffected by one another.

Memory layer 450 may have characteristics similar or identical to those of memory layer 250 discussed elsewhere herein.

Template layer 460 may have characteristics similar or identical to those of template layer 260 discussed elsewhere herein.

The electrical conductivity of the template layer 460 is similar to conductivity of commonly used metallic bottom electrodes, such as Ru. In addition, the crystalline structure and lattice parameters of the template layer 460 are similar to those of the memory layer 450. Consequently, misfit stresses between the template layer 460 and the memory layer 450 are minimized.

In some embodiments, the template layer 460 behaves as a latency layer at least partly because of its low resistivity. Accordingly, the resistance of the memory device 400 is lowered. This, combined with the effect of the retention layer 440 and the high on/off resistance ratio, increases the memory window, such that low read voltages may be used. For example, the read voltage can be about 0.5V, about 0.4V, 0.3V, 0.2V, 0.1V or lower.

The template layer 460 may be formed using any deposition process, such as physical vapor deposition (PVD), chemical vapor deposition (CVD), sputtering, evaporation, atomic layer deposition (ALD), or another deposition or growth process.

In some embodiments, memory layer 450 may be epitaxially grown on template layer 460. In some embodiments, the memory layer 450 is formed into thin films (e.g. epitaxially grown crystalline thin films) on the template layer 460 at temperatures lower than 450 C. In some embodiments, the temperature while forming the template layer 460 may be 400 C. or less, 450 C. or less, 400 C. or less, 450 C. or less, or 400 C. or less. Because of the low temperature while forming the template layer 460, the template layer 460 may be formed as part of a CMOS manufacturing process.

Furthermore, in some embodiments, template layer 460 experiences substantially no chemical reaction with the memory layer 450, such that the characteristics of the memory layer 450 remain substantially unaffected by the template layer 460. Also, in some embodiments, substantially no diffusion occurs between the template layer 460 and the memory layer 450, such that the characteristics of the memory layer 450 remain substantially unaffected by the template layer 460.

In some embodiments, the crystalline film of the memory layer 450 may be grown on an amorphous template layer 460 acting as a growth seed. In some embodiments, the crystalline film of the memory layer 450 may be grown on a crystalline template layer 460 acting as a seed. When the memory layer 450 is grown, the ambient environment (e.g., Ar and $O_2$) may have a pressure between 9 and 10 torr. In some embodiments, water is removed from the ambient environment.

In some embodiments, when the memory layer 450 is formed on the template layer 460, no or substantially no amorphous memory layer 450 or interface layer is formed at the interface between the memory layer 450 and the template layer 460. Accordingly, the thickness of the memory layer 450 is reduced, which is beneficial for high density devices.

The typical on/off resistance ratio (the ratio of the resistance of the on or low resistance state of the memory device 400 to the resistance of the off or high resistance state of the memory device 400) for interface switching material films is not amenable for multi-bit storage in a single cell. However, in embodiments such as that illustrated in FIG. 4, because of the substantially defect free interface between the memory layer 450 and the template layer 460 and because of the high quality crystalline structure of the memory layer 450, few, if any, oxygen ions are trapped by crystal defects, such that substantially all of the oxygen ions are free to migrate between the memory layer 450 and the top electrode 430, and the on/off resistance ratio of the memory device 400 is maximized. For example, the on/off resistance ratio may be 2 or greater, 5 or greater, 10 or greater, 20 or greater, 35 or greater, 50 or greater, 75 or greater, or 100 or greater.

Reliability of interface switching memories which conduct ions and vacancies between layers depends critically on losses of the critical species from the cell. Therefore, techniques to prevent any losses of the critical species from the cell during the cycling and retention are beneficial.

In memory device 400, top barrier layer 420 has little or a substantially zero oxygen ion diffusion coefficient, such that the oxygen ions and vacancies are confined to top electrode layer 430, retention layer 440 (if present), memory layer 450, and template layer 460 by top barrier layer 420. As a result, the reliability of memory device 400 is excellent.

Figure 5:
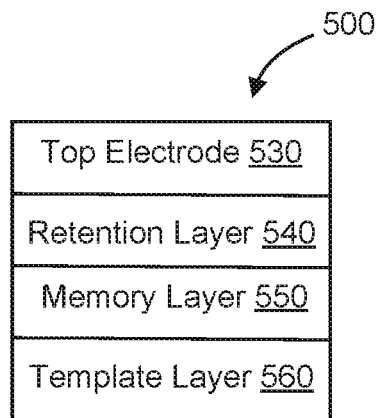
FIG. 5 is a schematic illustration of a memory device according to an embodiment.

FIG. 5 is a schematic illustration of a memory device 500 according to an embodiment. Memory device 500 includes template layer 560, memory layer 550, optional retention layer 540, and top electrode layer 530.

Memory device 500 may be formed by forming template layer 560, forming memory layer 550 on template layer 560, optionally forming retention layer 540 on memory layer 550, and forming top electrode layer 530 on retention layer 540.

In some embodiments, each of the interfaces of the various layers of memory device 500 forms an ohmic contact between the layers.

Top electrode layer 530 may have characteristics similar or identical to those of top electrode layer 230 discussed elsewhere herein.

Top electrode layer 530 forms an electrical connection between the retention layer 540 and other electrical components. Top electrode layer 530 may also be used to form a mechanical connection between the memory device 500 and another device. Top electrode layer 530 is formed with a material which forms a secure bond with the retention layer 540.

Top electrode layer 530 cooperatively forms a metal oxide heterojunction memory with memory layer 550, and is configured to accept or donate oxygen ions or vacancies from or to memory layer 550 in response to an electric field applied across the electrode layer 530 and the memory layer 550. In some embodiments, the top electrode layer 530 may be oxygen-rich and may cooperatively form an oxygen ion heterojunction memory cell with memory layer 550. In alternative embodiments, the top electrode layer 530 may be oxygen depleted and may cooperatively form an oxygen vacancy heterojunction memory cell with memory layer 550.

Optional retention layer 540 may have characteristics similar or identical to those of optional retention layer 240 discussed elsewhere herein.

In some embodiments, retention layer 540 may experience no chemical interaction with the top electrode layer 530 and memory layer 550. Additionally, retention layer 540 may form an ohmic contact with top electrode 530.

Data retention in the memory cell is greatly influenced by the diffusion of oxygen ions and oxygen vacancies between the top electrode layer 530 and the memory layer 550. Retention layer 540 may be placed between the top electrode layer 530 and the memory layer 550 and improves memory cell retention. Because retention layer 540 is resistant to conduction of oxygen ions and vacancies, oxygen ions and vacancies are less likely to diffuse between the oxide on the retention layer 540 side of top electrode layer 530 and the memory layer 550, and data retention is improved. In addition, because retention layer 540 is electrically conductive, electrical performance of the memory cell experiences little or substantially no degradation as a consequence of retention layer 540.

The retention layer 540 may be formed using any deposition process, such as PVD, CVD, sputtering, evaporation, ALD, or another deposition or growth process. Furthermore, in some embodiments, retention layer 540 experiences substantially no chemical reaction with the memory layer 550, such that the characteristics of the memory layer 550 and the retention layer 540 remain substantially unaffected by one another. Also, in some embodiments, substantially no diffusion occurs between the retention layer 540 and the memory layer 550, such that the characteristics of the memory layer 550 and the retention layer 540 remain substantially unaffected by one another.

Memory layer 550 may have characteristics similar or identical to those of memory layer 250 discussed elsewhere herein.

Template layer 560 may have characteristics similar or identical to those of template layer 260 discussed elsewhere herein.

The electrical conductivity of the template layer 560 is similar to conductivity of commonly used metallic bottom electrodes, such as Ru. In addition, the crystalline structure and lattice parameters of the template layer 560 are similar to those of the memory layer 550. Consequently, misfit stresses between the template layer 560 and the memory layer 550 are minimized.

In some embodiments, the template layer 560 behaves as a latency layer at least partly because of its low resistivity. Accordingly, the resistance of the memory device 500 is lowered. This, combined with the effect of the retention layer 540 and the high on/off resistance ratio, increases the memory window, such that low read voltages may be used. For example, the read voltage can be about 0.5V, about 0.4V, 0.3V, 0.2V, 0.1V or lower.

The template layer 560 may be formed using any deposition process, such as physical vapor deposition (PVD), chemical vapor deposition (CVD), sputtering, evaporation, atomic layer deposition (ALD), or another deposition or growth process.

In some embodiments, memory layer 550 may be epitaxially grown on template layer 560. In some embodiments, the memory layer 550 is formed into thin films (e.g. epitaxially grown crystalline thin films) on the template layer 560 at temperatures lower than 550 C. In some embodiments, the temperature while forming the template layer 560 may be 500 C. or less, 550 C. or less, 500 C. or less, 550 C. or less, or 500 C. or less. Because of the low temperature while forming the template layer 560, the template layer 560 may be formed as part of a CMOS manufacturing process.

Furthermore, in some embodiments, template layer 560 experiences substantially no chemical reaction with the memory layer 550, such that the characteristics of the memory layer 550 remain substantially unaffected by the template layer 560. Also, in some embodiments, substantially no diffusion occurs between the template layer 560 and the memory layer 550, such that the characteristics of the memory layer 550 remain substantially unaffected by the template layer 560.

In some embodiments, the crystalline film of the memory layer 550 may be grown on an amorphous template layer 560 acting as a growth seed. In some embodiments, the crystalline film of the memory layer 550 may be grown on a crystalline template layer 560 acting as a seed. When the memory layer 550 is grown, the ambient environment (e.g., Ar and $O_2$) may have a pressure between 9 and 10 torr. In some embodiments, water is removed from the ambient environment.

In some embodiments, when the memory layer 550 is formed on the template layer 560, no or substantially no amorphous memory layer 550 or interface layer is formed at the interface between the memory layer 550 and the template layer 560. Accordingly, the thickness of the memory layer 550 is reduced, which is beneficial for high density devices.

The typical on/off resistance ratio (the ratio of the resistance of the on or low resistance state of the memory device 500 to the resistance of the off or high resistance state of the memory device 500) for interface switching material films is not amenable for multi-bit storage in a single cell. However, in embodiments such as that illustrated in FIG. 5, because of the substantially defect free interface between the memory layer 550 and the template layer 560 and because of the high quality crystalline structure of the memory layer 550, few, if any, oxygen ions are trapped by crystal defects, such that substantially all of the oxygen ions are free to migrate between the memory layer 550 and the top electrode 530, and the on/off resistance ratio of the memory device 500 is maximized. For example, the on/off resistance ratio may be 2 or greater, 5 or greater, 10 or greater, 20 or greater, 35 or greater, 50 or greater, 75 or greater, or 100 or greater.

Figure 6:
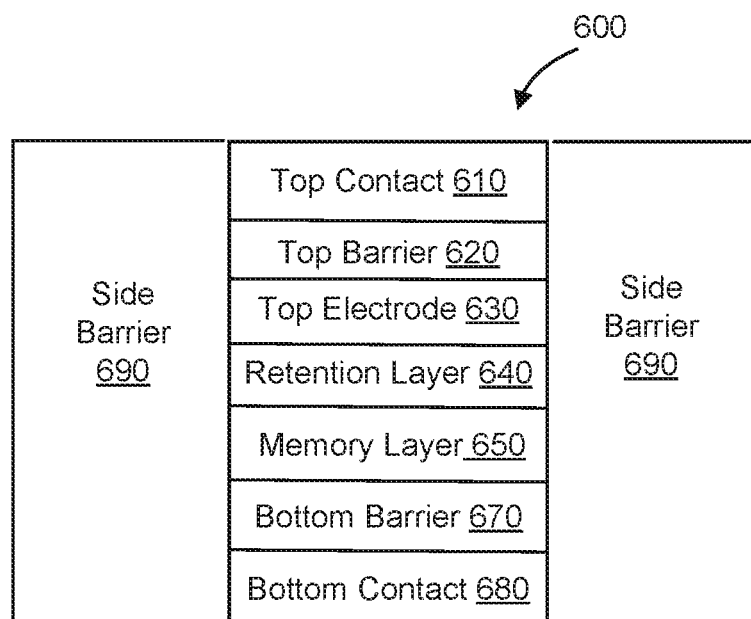
FIG. 6 is a schematic illustration of a memory device according to an embodiment.

FIG. 6 is a schematic illustration of a memory device 600 according to an embodiment. Memory device 600 includes bottom contact 680, conductive bottom barrier layer 670, memory layer 650, optional retention layer 640, top electrode layer 630, top barrier layer 620, top contact 610, and side barrier layer 690. In some embodiments, side barrier layer 690 is substantially annular and surrounds bottom contact 680, conductive bottom barrier layer 670, memory layer 650, retention layer 640 (if present), top electrode layer 630, top barrier layer 620, and top contact 610.

Memory device 600 may be formed by forming bottom contact 680, forming conductive bottom barrier layer 670 on bottom contact 680, forming memory layer 650 on conductive bottom barrier layer 670, optionally forming retention layer 640 on memory layer 650, forming top electrode layer 630 on retention layer 640 or on memory layer 650, forming top barrier layer 620 on top electrode layer 630, forming top contact 610 on top barrier layer 620, and forming side barrier layer 690 on both lateral sides of each of bottom contact 680, conductive bottom barrier layer 670, memory layer 650, retention layer 640 (if present), top electrode layer 630, top barrier layer 620, and top contact 610.

In some embodiments, each of the interfaces of the various layers of memory device 600 forms an ohmic contact between the layers.

In some embodiments, top contact 610 includes at least one of Copper (Cu), Aluminum (Al), Tungsten (W), Ruthenium (Ru), Platinum (Pt), Iridium (Ir), and Rhodium (Rh). In alternative embodiments, one or more other materials are used.

Top contact 610 is used to form an electrical connection between the memory device 600 and other electrical components. Top contact 600 may also be used to form a mechanical connection between the memory device 600 and another device.

In some embodiments, top barrier layer 620 includes at least one of Titanium Nitride (TiN), Tantalum Nitride (TaN), and Titanium Tungsten (TiW). In alternative embodiments, one or more other materials are used.

Top barrier layer 620 may be formed of a material having a band gap wider than that of one or more of the top electrode layer 630, any retention layer 640, and the memory layer 650. Top barrier layer 620 is configured to substantially prevent the conduction of oxygen ions or vacancies during operation of the memory device 600. Accordingly, top barrier layer 620 substantially prevents oxygen ions or vacancies from escaping from the top electrode layer 630 into the top barrier layer 620. In addition, top barrier layer 620 is configured to conduct electrical current between the top electrode layer 630 and the top contact 610.

The top barrier layer 620 may be formed using any deposition process, such as PVD, CVD, sputtering, evaporation, ALD, or another deposition or growth process. Furthermore, in some embodiments, top barrier layer 620 experiences substantially no chemical reaction with the top electrode 630, such that the characteristics of the top barrier layer 620 and the top electrode 630 remain substantially unaffected by one another. Also, in some embodiments, substantially no diffusion occurs between the top barrier layer 620 and the top electrode 630, such that the characteristics of the memory layer 650 and the retention layer 640 remain substantially unaffected by one another.

In some embodiments, top electrode layer 630 includes at least one of Tungsten (W), Molybdenum (Mo), Nickel (Ni), Iron (Fe), Cobalt (Co), and Chromium (Cr). In alternative embodiments, one or more other materials are used. For example, another metal, conductive oxide, or other conductive compound may be use.

Top electrode layer 630 forms an electrical connection between the retention layer 640 or the memory layer 650 and the top barrier layer 620. Top electrode layer 630 is formed with a material which forms a secure bond with the retention layer 640 or the memory layer 650.

Top electrode layer 630 cooperatively forms a metal oxide heterojunction memory with memory layer 650, and is configured to accept or donate oxygen ions or vacancies from or to memory layer 650 in response to an electric field applied across the electrode layer 630 and the memory layer 650. In some embodiments, the top electrode layer 630 may be oxygen-rich and may cooperatively form an oxygen ion heterojunction memory cell with memory layer 650. In alternative embodiments, the top electrode layer 630 may be oxygen depleted and may cooperatively form an oxygen vacancy heterojunction memory cell with memory layer 650.

In some embodiments, optional retention layer 640 includes at least one of $SnO_x$, $InO_x$, $(In, Sn)O_x$, and doped ZnO. In alternative embodiments, one or more other materials are used.

In some embodiments, retention layer 640 has high electrical conductivity electrical conductivity. For example, retention layer 640 may have conductivity greater than 1 E-4 ohm-m. Retention layer 640 may also be resistant to conduction of oxygen ions and vacancies in response to an applied electric field. In addition, voltage dependence of the ionic conductivity of retention layer 640 may be highly non-linear. Furthermore, retention layer 640 may experience no chemical interaction with the top electrode layer 630 and memory layer 650. Additionally, retention layer 640 may form an ohmic contact with top electrode 630.

Data retention in the memory cell is greatly influenced by the diffusion of oxygen ions and oxygen vacancies between the top electrode layer 630 and the memory layer 650. Retention layer 640 may be placed between the top electrode layer 630 and the memory layer 650 and improves memory cell retention. Because retention layer 640 is resistant to conduction of oxygen ions and vacancies, oxygen ions and vacancies are less likely to diffuse between the oxide on the retention layer 640 side of top electrode layer 630 and the memory layer 650, and data retention is improved. In addition, because retention layer 640 is electrically conductive, electrical performance of the memory cell experiences little or substantially no degradation as a consequence of retention layer 640.

The retention layer 640 may be formed using any deposition process, such as PVD, CVD, sputtering, evaporation, ALD, or another deposition or growth process. Furthermore, in some embodiments, retention layer 640 experiences substantially no chemical reaction with the memory layer 650, such that the characteristics of the memory layer 650 and the retention layer 640 remain substantially unaffected by one another. Also, in some embodiments, substantially no diffusion occurs between the retention layer 640 and the memory layer 650, such that the characteristics of the memory layer 650 and the retention layer 640 remain substantially unaffected by one another.

In some embodiments, memory layer 650 includes at least one of Praseodymium Calcium Manganese Oxide or (Pr1-xCax)MnO$_3$ (PCMO), (Sm1-xCax)MnO$_3$, and (La1-xSrx)MnO$_3$. In alternative embodiments, one or more other materials are used. In some embodiments, the memory layer 650 is between about 5 nm and about 10 nm thick.

In some embodiments, conductive bottom barrier layer 670 includes at least one of Titanium Nitride (TiN), Tantalum Nitride (TaN), and Titanium Tungsten (TiW). In alternative embodiments, one or more other materials are used. In some embodiments, conductive bottom barrier layer 670 is formed of substantially the same material as the top barrier layer 620.

Bottom barrier layer 670 may be formed of a material having a band gap wider than that of one or more of any retention layer 640, and the memory layer 650. Bottom barrier layer 670 is configured to substantially prevent the conduction of oxygen ions or vacancies during operation of the memory device 600. Accordingly, bottom barrier layer 670 substantially prevents oxygen ions or vacancies from escaping from the memory layer 650 into the bottom barrier layer 670. In addition, bottom barrier layer 670 is configured to conduct electrical current between the memory layer 650 and the bottom contact 680.

The bottom barrier layer 670 may be formed using any deposition process, such as PVD, CVD, sputtering, evaporation, ALD, or another deposition or growth process. Furthermore, in some embodiments, bottom barrier layer 670 experiences substantially no chemical reaction with the bottom contact 680, such that the characteristics of the bottom barrier layer 670 and the bottom contact 680 remain substantially unaffected by one another. Also, in some embodiments, substantially no diffusion occurs between the bottom barrier layer 670 and the bottom contact 680, such that the characteristics of the bottom barrier layer 670 and the bottom contact 680 remain substantially unaffected by one another.

In some embodiments, bottom contact 680 includes at least one of Copper (Cu), Aluminum (Al), Tungsten (W), Ruthenium (Ru), Platinum (Pt), Iridium (Ir), and Rhodium (Rh). In alternative embodiments, one or more other materials are used. In some embodiments, bottom contact 680 is formed of substantially the same material as the top contact 610.

In some embodiments, side barrier 690 includes at least one of AlOx, SiO$_2$, and Si$_3$N$_4$. In alternative embodiments, one or more other materials are used.

Reliability of interface switching memories which conduct ions and vacancies between layers depends critically on losses of the critical species from the cell. Therefore, techniques to prevent any losses of the critical species from the cell during the cycling and retention are beneficial.

In memory device 600, top barrier layer 620, bottom barrier layer 670, and side barrier layers 690 have little or substantially zero oxygen ion diffusion coefficients, such that the oxygen ions and vacancies are confined to top electrode layer 630, retention layer 640 (if present), and memory layer 650, by top barrier layer 620, bottom barrier layer 670, and side barrier layers 690. As a result, the reliability of memory device 600 is excellent.

The side barrier layers 690 may be formed using any deposition process, such as PVD, CVD, sputtering, evaporation, ALD, or another deposition or growth process. Furthermore, in some embodiments, side barrier layers 690 experience substantially no chemical reaction with the other layers, such that the characteristics of the side barrier layers 690 and the other layers remain substantially unaffected by one another. Also, in some embodiments, substantially no diffusion occurs between the side barrier layers 690 and the other layers, such that the characteristics of the side barrier layers 690 and the other layers remain substantially unaffected by one another.

In certain embodiments, bottom contact 680 is formed with Cu, conductive bottom barrier layer 670 is formed with TaN, memory layer 650 is formed with PCMO, retention layer 640 is formed with SnO, top electrode layer 630 is formed with W, top barrier layer 620 is formed with TaN, and top contact 610 is formed with Cu.

In certain embodiments, bottom contact 680 is formed with Ru, conductive bottom barrier layer 670 is formed with TaN, memory layer 650 is formed with PCMO, retention layer 640 is formed with doped ZnO, top electrode layer 630 is formed with W, top barrier layer 620 is formed with TaN, and top contact 610 is formed with Ru.

In certain embodiments, bottom contact 680 is formed with W, conductive bottom barrier layer 670 is formed with TaN, memory layer 650 is formed with (SmCa)MnO$_3$, retention layer 640 is formed with InOx, top electrode layer 630 is formed with W, top barrier layer 620 is formed with TaN, and top contact 610 is formed with Cu.

Figure 7:
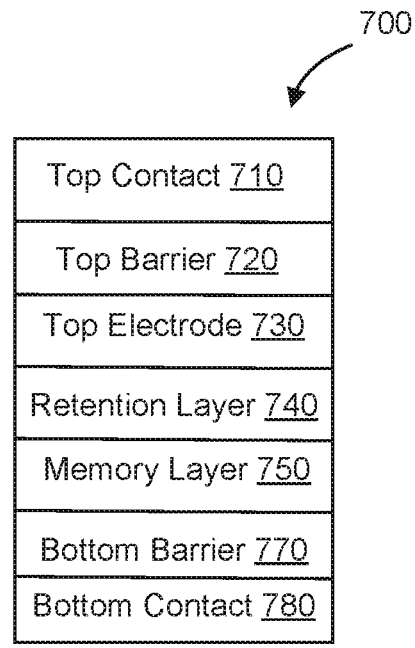
FIG. 7 is a schematic illustration of a memory device according to an embodiment.

FIG. 7 is a schematic illustration of a memory device 700 according to an embodiment. Memory device 700 includes bottom contact 780, conductive bottom barrier layer 770, memory layer 750, optional retention layer 740, top electrode layer 730, top barrier layer 720, and top contact 710.

Memory device 700 may be formed by forming bottom contact 780, forming conductive bottom barrier layer 770 on bottom contact 780, forming memory layer 750 on conductive bottom barrier layer 770, optionally forming retention layer 740 on memory layer 750, forming top electrode layer 730 on retention layer 740 or on memory layer 750, forming top barrier layer 720 on top electrode layer 730, and forming top contact 710 on top barrier layer 720.

In some embodiments, each of the interfaces of the various layers of memory device 700 forms an ohmic contact between the layers.

Top contact 710 may have characteristics similar or identical to those of top contact 210 discussed elsewhere herein.

Top contact 710 is used to form an electrical connection between the memory device 700 and other electrical components. Top contact 700 may also be used to form a mechanical connection between the memory device 700 and another device.

Top barrier layer 720 may have characteristics similar or identical to those of top barrier layer 220 discussed elsewhere herein.

Top barrier layer 720 may be formed of a material having a band gap wider than that of one or more of the top electrode layer 730, any retention layer 740, and the memory layer 750. Top barrier layer 720 is configured to substantially prevent the conduction of oxygen ions or vacancies during operation of the memory device 700. Accordingly, top barrier layer 720 substantially prevents oxygen ions or vacancies from escaping from the top electrode layer 730 into the top barrier layer 720. In addition, top barrier layer 720 is configured to conduct electrical current between the top electrode layer 730 and the top contact 710.

The top barrier layer 720 may be formed using any deposition process, such as PVD, CVD, sputtering, evaporation, ALD, or another deposition or growth process. Furthermore, in some embodiments, top barrier layer 720 experiences substantially no chemical reaction with the top electrode 730, such that the characteristics of the top barrier layer 720 and the top electrode 730 remain substantially unaffected by one another. Also, in some embodiments, substantially no diffusion occurs between the top barrier layer 720 and the top electrode 730, such that the characteristics of the memory layer 750 and the retention layer 740 remain substantially unaffected by one another.

Top electrode layer 730 may have characteristics similar or identical to those of top electrode layer 630 discussed elsewhere herein.

Top electrode layer 730 forms an electrical connection between the retention layer 740 or the memory layer 750 and the top barrier layer 720. Top electrode layer 730 is formed with a material which forms a secure bond with the retention layer 740 or the memory layer 750.

Top electrode layer 730 cooperatively forms a metal oxide heterojunction memory with memory layer 750, and is configured to accept or donate oxygen ions or vacancies from or to memory layer 750 in response to an electric field applied across the electrode layer 730 and the memory layer 750. In some embodiments, the top electrode layer 730 may be oxygen-rich and may cooperatively form an oxygen ion heterojunction memory cell with memory layer 750. In alternative embodiments, the top electrode layer 730 may be oxygen depleted and may cooperatively form an oxygen vacancy heterojunction memory cell with memory layer 750.

Optional retention layer 740 may have characteristics similar or identical to those of optional retention layer 240 discussed elsewhere herein.

In some embodiments, retention layer 740 may experience no chemical interaction with the top electrode layer 730 and memory layer 750. Additionally, retention layer 740 may form an ohmic contact with top electrode 730.

Data retention in the memory cell is greatly influenced by the diffusion of oxygen ions and oxygen vacancies between the top electrode layer 730 and the memory layer 750. Retention layer 740 may be placed between the top electrode layer 730 and the memory layer 750 and improves memory cell retention. Because retention layer 740 is resistant to conduction of oxygen ions and vacancies, oxygen ions and vacancies are less likely to diffuse between the oxide on the retention layer 740 side of top electrode layer 730 and the memory layer 750, and data retention is improved. In addition, because retention layer 740 is electrically conductive, electrical performance of the memory cell experiences little or substantially no degradation as a consequence of retention layer 740.

The retention layer 740 may be formed using any deposition process, such as PVD, CVD, sputtering, evaporation, ALD, or another deposition or growth process. Furthermore, in some embodiments, retention layer 740 experiences substantially no chemical reaction with the memory layer 750, such that the characteristics of the memory layer 750 and the retention layer 740 remain substantially unaffected by one another. Also, in some embodiments, substantially no diffusion occurs between the retention layer 740 and the memory layer 750, such that the characteristics of the memory layer 750 and the retention layer 740 remain substantially unaffected by one another.

Memory layer 750 may have characteristics similar or identical to those of memory layer 250 discussed elsewhere herein.

Conductive bottom barrier layer 770 may have characteristics similar or identical to those of conductive bottom barrier layer 270 discussed elsewhere herein. In some embodiments, conductive bottom barrier layer 770 is formed of substantially the same material as the top barrier layer 720.

Bottom barrier layer 770 may be formed of a material having a band gap wider than that of one or more of any retention layer 740 and the memory layer 750. Bottom barrier layer 770 is configured to substantially prevent the conduction of oxygen ions or vacancies during operation of the memory device 700. Accordingly, bottom barrier layer 770 substantially prevents oxygen ions or vacancies from escaping from the memory layer 750 into the bottom barrier layer 770. In addition, bottom barrier layer 770 is configured to conduct electrical current between the memory layer 750 and the bottom contact 780.

The bottom barrier layer 770 may be formed using any deposition process, such as PVD, CVD, sputtering, evaporation, ALD, or another deposition or growth process. Furthermore, in some embodiments, bottom barrier layer 770 experiences substantially no chemical reaction with the bottom contact 780, such that the characteristics of the bottom barrier layer 770 and the bottom contact 780 remain substantially unaffected by one another. Also, in some embodiments, substantially no diffusion occurs between the bottom barrier layer 770 and the bottom contact 780, such that the characteristics of the bottom barrier layer 770 and the bottom contact 780 remain substantially unaffected by one another.

Bottom contact 780 may have characteristics similar or identical to those of conductive bottom contact 280 discussed elsewhere herein. In some embodiments, bottom contact 780 is formed of substantially the same material as the top contact 710.

Reliability of interface switching memories which conduct ions and vacancies between layers depends critically on losses of the critical species from the cell. Therefore, techniques to prevent any losses of the critical species from the cell during the cycling and retention are beneficial.

In memory device 700, top barrier layer 720 and bottom barrier layer 770 have little or substantially zero oxygen ion diffusion coefficients, such that the oxygen ions and vacancies are confined to top electrode layer 730, retention layer 740 (if present), and memory layer 750 by top barrier layer 720 and bottom barrier layer 770. As a result, the reliability of memory device 700 is excellent.

In certain embodiments, bottom contact 780 is formed with Cu, conductive bottom barrier layer 770 is formed with TaN, memory layer 750 is formed with PCMO, retention layer 740 is formed with SnO, top electrode layer 730 is formed with W, top barrier layer 720 is formed with TaN, and top contact 710 is formed with Cu.

In certain embodiments, bottom contact 780 is formed with Ru, conductive bottom barrier layer 770 is formed with TaN, memory layer 750 is formed with PCMO, retention layer 740 is formed with doped ZnO, top electrode layer 730 is formed with W, top barrier layer 720 is formed with TaN, and top contact 710 is formed with Ru.

In certain embodiments, bottom contact 780 is formed with W, conductive bottom barrier layer 770 is formed with TaN, memory layer 750 is formed with $(SmCa)MnO_3$, retention layer 740 is formed with InOx, top electrode layer 730 is formed with W, top barrier layer 720 is formed with TaN, and top contact 710 is formed with Cu.

Figure 8:
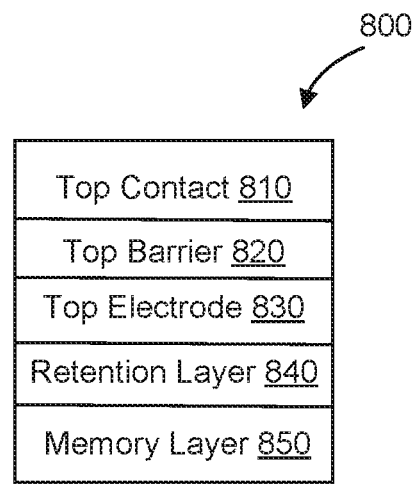
FIG. 8 is a schematic illustration of a memory device according to an embodiment.

FIG. 8 is a schematic illustration of a memory device 800 according to an embodiment. Memory device 800 includes memory layer 850, optional retention layer 840, top electrode layer 830, top barrier layer 820, and top contact 810.

Memory device 800 may be formed by forming memory layer 850, optionally forming retention layer 840 on memory layer 850, forming top electrode layer 830 on retention layer 840 or on memory layer 850, forming top barrier layer 820 on top electrode layer 830, and forming top contact 810 on top barrier layer 820.

In some embodiments, each of the interfaces of the various layers of memory device 800 forms an ohmic contact between the layers.

Top contact 810 may have characteristics similar or identical to those of top contact 210 discussed elsewhere herein.

Top contact 810 is used to form an electrical connection between the memory device 800 and other electrical components. Top contact 810 may also be used to form a mechanical connection between the memory device 800 and another device.

Top barrier layer 820 may have characteristics similar or identical to those of top barrier layer 220 discussed elsewhere herein.

Top barrier layer 820 may be formed of a material having a band gap wider than that of one or more of the top electrode layer 830, any retention layer 840, and the memory layer 850. Top barrier layer 820 is configured to substantially prevent the conduction of oxygen ions or vacancies during operation of the memory device 800. Accordingly, top barrier layer 820 substantially prevents oxygen ions or vacancies from escaping from the top electrode layer 830 into the top barrier layer 820. In addition, top barrier layer 820 is configured to conduct electrical current between the top electrode layer 830 and the top contact 810.

The top barrier layer 820 may be formed using any deposition process, such as PVD, CVD, sputtering, evaporation, ALD, or another deposition or growth process. Furthermore, in some embodiments, top barrier layer 820 experiences substantially no chemical reaction with the top electrode 830, such that the characteristics of the top barrier layer 820 and the top electrode 830 remain substantially unaffected by one another. Also, in some embodiments, substantially no diffusion occurs between the top barrier layer 820 and the top electrode 830, such that the characteristics of the memory layer 850 and the retention layer 840 remain substantially unaffected by one another.

Top electrode layer 830 may have characteristics similar or identical to those of top electrode layer 230 discussed elsewhere herein.

Top electrode layer 830 forms an electrical connection between the retention layer 840 or the memory layer 850 and the top barrier layer 820. Top electrode layer 830 is formed with a material which forms a secure bond with the retention layer 840 or the memory layer 850.

Top electrode layer 830 cooperatively forms a metal oxide heterojunction memory with memory layer 850, and is configured to accept or donate oxygen ions or vacancies from or to memory layer 850 in response to an electric field applied across the electrode layer 830 and the memory layer 850. In some embodiments, the top electrode layer 830 may be oxygen-rich and may cooperatively form an oxygen ion heterojunction memory cell with memory layer 850. In alternative embodiments, the top electrode layer 830 may be oxygen depleted and may cooperatively form an oxygen vacancy heterojunction memory cell with memory layer 850.

Optional retention layer 840 may have characteristics similar or identical to those of optional retention layer 240 discussed elsewhere herein.

In some embodiments, retention layer 840 may experience no chemical interaction with the top electrode layer 830 and memory layer 850. Additionally, retention layer 840 may form an ohmic contact with top electrode 830.

Data retention in the memory cell is greatly influenced by the diffusion of oxygen ions and oxygen vacancies between the top electrode layer 830 and the memory layer 850. Retention layer 840 may be placed between the top electrode layer 830 and the memory layer 850 and improves memory cell retention. Because retention layer 840 is resistant to conduction of oxygen ions and vacancies, oxygen ions and vacancies are less likely to diffuse between the oxide on the retention layer 840 side of top electrode layer 830 and the memory layer 850, and data retention is improved. In addition, because retention layer 840 is electrically conductive, electrical performance of the memory cell experiences little or substantially no degradation as a consequence of retention layer 840.

The retention layer 840 may be formed using any deposition process, such as PVD, CVD, sputtering, evaporation, ALD, or another deposition or growth process. Furthermore, in some embodiments, retention layer 840 experiences substantially no chemical reaction with the memory layer 850, such that the characteristics of the memory layer 850 and the retention layer 840 remain substantially unaffected by one another. Also, in some embodiments, substantially no diffusion occurs between the retention layer 840 and the memory layer 850, such that the characteristics of the memory layer 850 and the retention layer 840 remain substantially unaffected by one another.

Memory layer 850 may have characteristics similar or identical to those of memory layer 250 discussed elsewhere herein.

Reliability of interface switching memories which conduct ions and vacancies between layers depends critically on losses of the critical species from the cell. Therefore, techniques to prevent any losses of the critical species from the cell during the cycling and retention are beneficial.

In memory device 800, top barrier layer 820 has little or a substantially zero oxygen ion diffusion coefficient, such that the oxygen ions and vacancies are confined to top electrode layer 830, retention layer 840 (if present), and memory layer 850 by top barrier layer 820. As a result, the reliability of memory device 800 is excellent.

The cost of memories using an array of memory devices as described herein is much less than that of memories which use traditional non-volatile memory cells, such as DRAM cells. This is the case at least because of the following differences resulting from one or more of the features discussed herein as understood by those of skill in the art: 1)

Memory devices discussed herein have area that is much smaller than DRAM cells, 2) The manufacturing process for making DRAM cells typically includes forming a trench in the substrate, for example, for forming a capacitor, while memory devices such as memory device 100 may be manufactured without forming a trench.

The speed or access time of memories using an array of memory devices as described herein is much better than that of memories which use traditional non-volatile memory cells. This is the case at least because the electrical resistance of the layers and contacts outside of the memory layer is low, as discussed above with reference to each of the layers and contacts. Memory speed using memory devices as described herein is also improved over traditional memories because large memory systems using memory devices as described herein may be operated without speed crippling Error Correction Code (ECC) techniques as a result, for example, of reliable retention of the memory states of the memory devices. For example, memory systems having Megabyte, Gigabyte, Terabyte storage may be operated without speed crippling ECC techniques.

Though the present invention is disclosed by way of specific embodiments as described above, those embodiments are not intended to limit the present invention. Based on the methods and the technical aspects disclosed above, variations and changes may be made to the presented embodiments by those skilled in the art without departing from the spirit and the scope of the present invention.

What is claimed is:

1. A memory device, comprising:
a template layer; and
a memory layer connected to the template layer, wherein the memory layer has a variable resistance, and wherein a crystalline structure of the memory layer matches a crystalline structure of the template layer.

2. The memory device of claim 1, wherein the memory layer is epitaxially grown on the template layer.

3. The memory device of claim 1, wherein a conductivity of the template layer is greater than $10 \times 10^6$ S m$^{-1}$.

4. The memory device of claim 1, further comprising:
a first electrode on the memory layer, wherein the first electrode and the memory layer cooperatively form a heterojunction memory structure; and
a retention layer between the memory layer and the first electrode, wherein the retention layer has a variable ionic conductivity, and is configured to selectively resist ionic conduction.

5. The memory device of claim 4, wherein a resistivity of the retention layer is less than $1 \times 10^4$ Ohm-m.

6. The memory device of claim 1, further comprising a first electrode on the memory layer, wherein the first electrode and the memory layer cooperatively form a heterojunction memory structure, wherein a first contact formed at an interface between the template layer and the memory layer is ohmic, and wherein a second contact formed at an interface between the template layer and the first electrode is ohmic.

7. The memory device of claim 1, further comprising:
a first electrode on the memory layer, wherein the first electrode and the memory layer cooperatively form a heterojunction memory structure;
a first barrier layer, configured to substantially prevent conduction of ions or vacancies therethrough, wherein the first electrode is between the first barrier layer and the memory layer; and
a second barrier layer, configured to substantially prevent conduction of ions or vacancies therethrough, wherein the template layer is between the second barrier layer and the memory layer.

8. The memory device of claim 7, wherein the first and second barrier layers each have a resistivity less than 1 E-4 Ohm-m.

9. The memory device of claim 7, further comprising a side barrier layer, wherein the first and second barrier layers and the side barrier layer define an enclosed space, wherein the first electrode and the memory layer are within the enclosed space, and wherein ions of the first electrode and the memory layer are confined to the enclosed space by the first and second barrier layers and the side barrier layer.

10. A method of manufacturing a memory device, the method comprising:
forming a template layer; and
connecting a memory layer to the template layer, wherein the memory layer has a variable resistance, and wherein a crystalline structure of the memory layer matches a crystalline structure of the template layer.

11. The method of claim 10, further comprising epitaxially growing the memory layer on the template layer.

12. The method of claim 10, wherein a conductivity of the template layer is greater than $10 \times 10^6$ S m$^{-1}$.

13. The method of claim 10, further comprising:
forming a first electrode on the memory layer, wherein the first electrode and the memory layer cooperatively form a heterojunction memory structure; and
forming a retention layer between the memory layer and the first electrode, wherein the retention layer has a variable ionic conductivity, and is configured to selectively resist ionic conduction.

14. The method of claim 13, wherein a resistivity of the retention layer is less than $1 \times 10^{-4}$ Ohm-m.

15. The method of claim 10, further comprising forming a first electrode on the memory layer, wherein the first electrode and the memory layer cooperatively form a heterojunction memory structure, wherein a first contact formed at an interface between the template layer and the memory layer is ohmic, and wherein a second contact formed at an interface between the template layer and the first electrode is ohmic.

16. The method of claim 10, further comprising:
forming a first electrode on the memory layer, wherein the first electrode and the memory layer cooperatively form a heterojunction memory structure;
forming a first barrier layer, wherein the first barrier layer is configured to substantially prevent conduction of ions or vacancies therethrough, and wherein the first electrode is between the first barrier layer and the memory layer; and
forming a second barrier layer, wherein the second barrier layer is configured to substantially prevent conduction of ions or vacancies therethrough, and wherein the template layer is between the second barrier layer and the memory layer.

17. The method of claim 16, wherein the first and second barrier layers each have a resistivity less than 1 E-4 Ohm-m.

18. The method of claim 16, further comprising forming a side barrier layer, wherein the first and second barrier layers and the side barrier layer define an enclosed space, wherein the first electrode and the memory layer are within the enclosed space, and wherein ions of the first electrode and the memory layer are confined to the enclosed space by the first and second barrier layers and the side barrier layer.

19. A method of using a memory device, the memory device comprising a template layer and a memory layer connected to the template layer, wherein the memory layer has a variable resistance, and wherein a crystalline structure of the memory layer matches a crystalline structure of the template layer, the method comprising:
- applying a first voltage difference across the template layer and the memory layer, whereby an electric field is generated in the memory layer, and such that a resistivity state of the memory layer is changed;
- applying a second voltage difference across the template layer and the memory layer;
- while the second voltage difference is applied, causing a first current to be conducted through the template layer and the memory layer; and
- determining the resistivity state of the memory layer based on the second voltage difference and the first current.

20. The method of claim 19, wherein a conductivity of the template layer is greater than $10 \times 10^6$ S m$^{-1}$.

21. The method of claim 19, wherein the memory device further comprises a first electrode on the memory layer, wherein the first electrode and the memory layer cooperatively form a heterojunction memory structure, wherein the memory device further comprises a retention layer between the memory layer and the first electrode, wherein the retention layer has a variable ionic conductivity, and is configured to selectively resist ionic conduction, and wherein the method further comprises varying the ionic conductivity of the retention layer with the first voltage difference.

22. The method of claim 21, wherein a resistivity of the retention layer is less than $1 \times 10^{-4}$ Ohm-m.

23. The method of claim 19, wherein the memory device further comprises:
- a first electrode on the memory layer, wherein the first electrode and the memory layer cooperatively form a heterojunction memory structure;
- a first barrier layer, configured to substantially prevent conduction of ions or vacancies therethrough, wherein the first electrode is between the first barrier layer and the memory layer; and
- a second barrier layer, configured to substantially prevent conduction of ions or vacancies therethrough, wherein the template layer is between the second barrier layer and the memory layer,
- wherein the method further comprises causing the first current to be conducted through the first and second barrier layers.

24. The method of claim 23, wherein the first and second barrier layers each have a resistivity less than 1 E-4 Ohm-m.

* * * * *